(12) United States Patent
Yeh et al.

(10) Patent No.: US 10,005,990 B2
(45) Date of Patent: Jun. 26, 2018

(54) CLEANING METHOD FOR SEMICONDUCTOR DEVICE FABRICATION

(71) Applicant: TAIWAN SEMICONDUCTOR MANUFACTURING COMPANY, LTD., Hsin-Chu (TW)

(72) Inventors: Ming-Hsi Yeh, Hsinchu (TW); Sung-Hsun Wu, Kaohsiung (TW); Chao-Cheng Chen, Hsin-Chu (TW); Syun-Ming Jang, Hsin-Chu (TW); Bo-Wei Chou, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 14/489,804

(22) Filed: Sep. 18, 2014

(65) Prior Publication Data

US 2015/0000704 A1    Jan. 1, 2015

Related U.S. Application Data (63) Continuation-in-part of application No. 13/757,094, filed on Feb. 1, 2013.

(51) Int. Cl.
| | |
|---|---|
| *B08B 3/00* | (2006.01) |
| *C11D 7/06* | (2006.01) |
| *C11D 7/08* | (2006.01) |
| *C11D 11/00* | (2006.01) |
| *H01L 21/02* | (2006.01) |

(Continued)

(52) U.S. Cl.
CPC ............ *C11D 7/06* (2013.01); *C11D 3/3947* (2013.01); *C11D 7/08* (2013.01); *C11D 11/0047* (2013.01); *H01L 21/02057* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,656,097 | A | 8/1997 | Olesen |
| 5,972,123 | A | 10/1999 | Verhaverbeke |
| 5,983,909 | A | 11/1999 | Yeol |

(Continued)

FOREIGN PATENT DOCUMENTS

| | | |
|---|---|---|
| JP | 2002-001243 | 1/2002 |
| KR | 20060115968 A | 11/2006 |

OTHER PUBLICATIONS

Lee, Gun-Ho et al "Particle Removal on Silicon Wafer Surface by Ozone-HF-NH4OH Sequence", Korean Chem. Eng. Res., vol. 45, No. 2, Apr. 2007, pp. 203-207.

(Continued)

*Primary Examiner* — Eric W Golightly
(74) *Attorney, Agent, or Firm* — Haynes and Boone, LLP (57) ABSTRACT

A method of cleaning a substrate such as semiconductor substrate for IC fabrication is described that includes cleaning the semiconductor substrate with a first mixture of ozone and one of an acid and a base, followed by a second mixture of ozone and the other one of the acid and the base. The cleaning mixtures may further include de-ionized water. In an embodiment, the mixture is sprayed onto a heated substrate surface. The acid may be HF; the base may be NH₄OH.

14 Claims, 5 Drawing Sheets

(51) Int. Cl.
H01L 21/67 (2006.01)
C11D 3/39 (2006.01)

(56) References Cited

U.S. PATENT DOCUMENTS

| | | | |
|---|---|---|---|
| 7,235,516 B2 | 6/2007 | Morinaga et al. | |
| 2004/0065540 A1* | 4/2004 | Mayer | C23C 18/1619 204/198 |
| 2005/0130420 A1 | 6/2005 | Huang | |
| 2006/0011214 A1 | 1/2006 | Liu et al. | |
| 2006/0234503 A1 | 10/2006 | Yamada et al. | |
| 2009/0275213 A1 | 11/2009 | Gotou et al. | |
| 2010/0167475 A1* | 7/2010 | Nara | H01L 29/66545 438/157 |
| 2011/0263133 A1 | 10/2011 | Hara | |
| 2014/0216499 A1 | 8/2014 | Li et al. | |
| 2015/0000704 A1 | 1/2015 | Yeh | |

OTHER PUBLICATIONS

Korean Intellectual Propery Office, Korean Office Action dated Jun. 18, 2015 for application 10-2014-0193136, 10 pages.

* cited by examiner

CLEANING METHOD FOR SEMICONDUCTOR DEVICE FABRICATION

CROSS REFERENCE

This application is a Continuation-in Part of U.S. Ser. No. 13/757,094 filed Feb. 1, 2013 and issued as U.S. Pat. No. 9,881,816 on Jan. 30, 2018, the entire disclosures of which are incorporated herein by reference.

BACKGROUND

The semiconductor integrated circuit (IC) industry has experienced rapid growth. Technological advances in IC materials and design have produced generation after generation with smaller and more complex circuits. During the course of this evolution, functional density has increased, while geometry size has decreased. This scaling down generally has led to production efficiencies and lowered costs. However, such scaling also increased processing and fabrication complexities. These complexities can have their own associated costs.

For example, as technology nodes decrease, one rising cost is the requirement of extensive volumes of chemicals used to support the manufacturing process and its complexity. The increase in chemical volume over time has associated costs of not only the acquisition of the chemical itself, but also in environmental impact. One process demanding great volumes of chemical is the wafer cleaning process. Wafer cleaning processes are performed through-out the fabrication process of an IC. Exemplary conventional cleaning processes are "standard clean 1" and "standard clean 2" also referred to as SC1 and SC2. The cleaning processes are typically used to remove particles (e.g., SC1) and/or metal ions (e.g., SC2). Although these existing cleaning processes have been generally satisfactory for specific purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
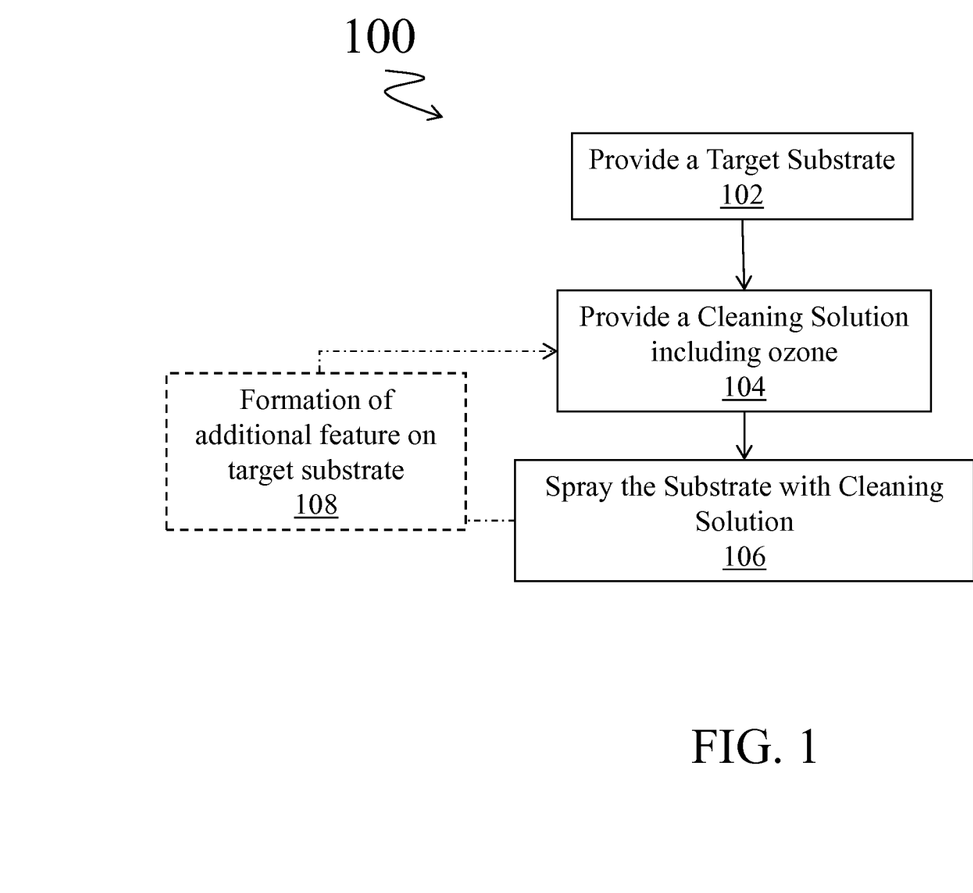
FIG. 1 is a flow chart illustrating an embodiment of a method of cleaning a semiconductor substrate according to one or more aspects of the present disclosure.

Illustrated in FIG. 1 is a method 100 of cleaning a substrate. It is understood that additional steps may be provided before, during and/or after the method 100. The method 100 begins at block 102 where a semiconductor substrate is provided.

In an embodiment, the substrate is a wafer. The substrate may have devices or portions thereof formed thereon, such as, for example, integrated circuits, light emitting diodes (LEDs), TFT-LCDs, memory cells and/or logic circuits. The substrate may further include passive components such as resistors, capacitors, inducers, fuses and/or active devices such as p-channel field effect transistors (PFETs), n-channel transistors (NFETs), metal-oxide-semiconductor field effect transistors (MOSFETs), complementary metal-oxide-semiconductor transistors (CMOSs), high voltage transistors, high frequency transistors, and/or other suitable components or portions thereof. One or more of the components may be partially fabricated (e.g., in process).

The substrate may be a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate may be strained, may be a semiconductor on insulator (SOI), have an epitaxial layer, and/or have other features enhancing performance. In other embodiments, the method 100 may be performed to clean a substrate that includes a non-semiconductor material, such as a glass substrate for thin-film-transistor liquid crystal display (TFT-LCD) devices, or fused quartz or calcium fluoride for a photomask (mask).

The substrate may comprise one or more material layers forming one or more features on the substrate. Exemplary materials that form the features include high-k dielectric layers, gate layers, hard mask layers, interfacial layers, capping layers, diffusion/barrier layers, dielectric layers, conductive layers, other suitable layers, and/or combinations thereof. In an embodiment, the method 100 is performed on a substrate having a gate feature formed on the surface (e.g., target surface to be cleaned). Other exemplary features include, but are not limited to, interconnect features (e.g., conductive lines and vias), contact features, source/drain features, conductive plate features, doped regions, isolation features, LED elements and portions thereof, trench features, dummy features, etc. In embodiments, such as discussed below, fin structures, typical of fin-type field effect transistors (finFETs) are disposed on the substrate.

The method 100 then proceeds to block 104 where a cleaning solution is provided. It is noted that the term "solution" as referred to herein does not necessitate a homogeneous mixture of any components, but rather simply a liquid and/or a gas providing having one or more chemical components mixed. The cleaning solution provided includes ozone. The cleaning solution further includes de-ionized water (DIW). The cleaning solution may also further include at least one of an acid or a base. In an embodiment, the cleaning solution includes ozone, DIW, and an acid or a base. Exemplary acids that may be included in the cleaning solution include hydrochloric acid (HCl) and hydrofluoric acid (HF). Exemplary bases that may be included in the cleaning solution include ammonium hydroxide ($NH_4OH$). In an embodiment, the cleaning solution includes only ozone, DIW, and one of an acid or a base. For example, the solution does not include hydrogen peroxide ($H_2O_2$). Thus, an exemplary composition of the cleaning solution includes $O_3$ and HF. Another exemplary composition of the cleaning solution includes $O_3$ and $NH_4OH$. Yet another exemplary composition of the cleaning solution includes $O_3$ and HCl. One or more of these exemplary compositions may further include DIW.

In an embodiment, the cleaning solution includes at least one part acid to one part ozone. In a further embodiment, the cleaning solution includes one part acid to one part ozone and greater than or equal to approximately 40 parts DIW. In a further embodiment, the cleaning solution includes one part acid to one part ozone and approximately 50 parts DIW. In an embodiment, the cleaning solution includes at least one part base to approximately eight (8) parts ozone. In a further embodiment, the cleaning solution includes one part base to approximately 8 parts ozone and approximately 60 parts DIW.

The method 100 then proceeds to block 106 where the cleaning solution is provided onto a surface of the substrate. The cleaning solution may be sprayed onto a surface of the target substrate. The cleaning solution may be sprayed onto the semiconductor substrate using a single-wafer spray tool.

In an embodiment, the target substrate is heated before and/or during the cleaning solution being incident the surface of the semiconductor wafer. In an embodiment, the substrate is heated to between approximately 30 degrees Celsius (C) and approximately 60 degrees C. In a further embodiment, the substrate is heated to approximately 40 degrees C. Heating the substrate may provide benefits such as increasing the solubility of ozone such as in DIW, acid or base; improving cleaning efficiency; reducing the amount of ozone lost; increasing impurity removal rate (e.g., $NH_4OH$); and/or other benefits now know or later appreciated.

The following process parameters are provided by way of example and are not intended to be limiting. In an embodiment, the chemical solution spray may be incident the substrate for approximately 20 to approximately 80 seconds. In a further embodiment, the chemical solution spray may be incident the substrate for approximately 30 to approximately 55 seconds, by way of example. The substrate may spin as the chemical solution is provided to its surface. In an embodiment, the substrate may rotate at approximately 800 rpm, by way of example.

After introduction of the cleaning solution, the block 106 may continue to provide a de-ionized water (DIW) rinse process. The rinse process may be between approximately 1 minute and approximately 2 minutes, by way of example. Block 106 may continue to include a dry process such as spin-dry process. Alternatively, the block 106 may include a plurality of processes having a cleaning solution such as discussed above provided to the target substrate, for example, the cleaning solutions having differing compositions (e.g., acid/ozone, base/ozone), as described below.

During the semiconductor device fabrication process, the cleaning performed by the cleaning solution of block 106 may be repeated any number of times as illustrated by the dashed line returning to block 104. In an embodiment, the cleaning process of block 106 is repeated in successive processes (e.g., without an interposing process), but with use of different chemical solutions. For example, block 106 may be performed first with a base (e.g., $NH_4OH$) and ozone, followed by a chemical solution clean of an acid (e.g., HCl) with ozone. As another example, block 106 may be performed first with an acid (e.g., HCl) and ozone, followed by a chemical solution clean of a base (e.g., $NH_4OH$) with ozone. In embodiments, processes may interpose the cleaning processes (such as, for example, rinse process(es), dry process(es), additional fabrication processes that form one or more features on the surface of the substrate such as the surface of substrate 404, described below with reference to FIG. 4) as illustrated by optional block 108. In other embodiments, the cleaning processes may be performed serially without interposing processes thereby omitting block 108.

The cleaning solution incident the surface of the semiconductor substrate may provide for etching/removing undesired material from the semiconductor substrate. For example, in an embodiment the cleaning solution includes HF which may remove a portion of an oxide such as $SiO_2$ on the target substrate. The cleaning solution incident the surface of the semiconductor substrate may provide for cleaning metallic particulates from the semiconductor substrate. For example, in an embodiment the cleaning solution includes HCl with ozone to remove and/or clean metals (e.g., unwanted metal ions). The cleaning solution incident the surface of the semiconductor substrate may provide for removing unwanted particulates from the semiconductor substrate. For example, in an embodiment the cleaning solution includes $NH_4OH$ with ozone to remove particulates. In one or more embodiments, the ozone may serve as a substrate surface oxidant useful in the cleaning process(es).

Figure 2:
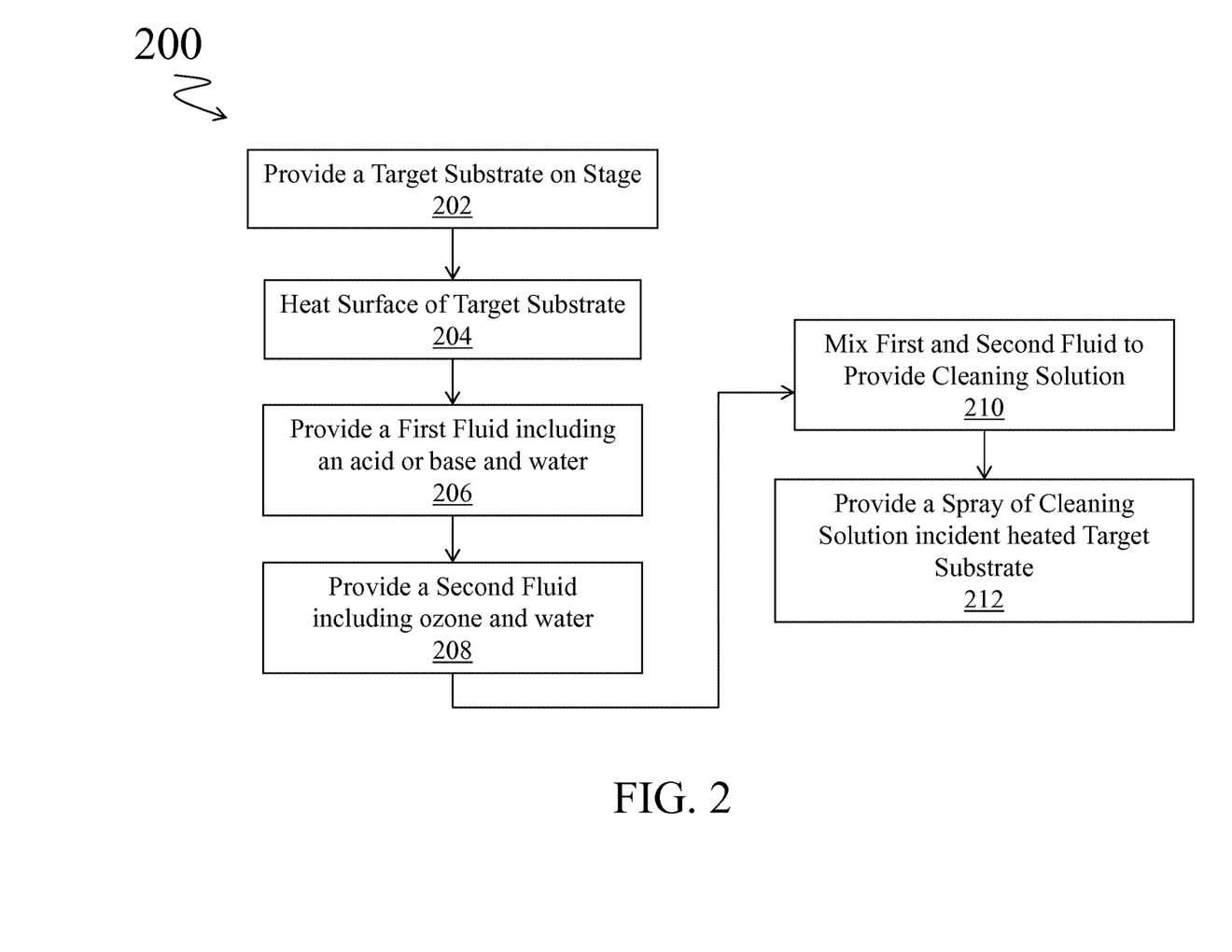
FIG. 2 is a flow chart illustrating an embodiment of the method of cleaning the semiconductor substrate according to the method of FIG. 1.

Referring now to the flow chart of FIG. 2, illustrated is a method 200 of cleaning a target substrate such as a semiconductor substrate or wafer. The method 200 may be an embodiment of the method 100, discussed above. As such, the descriptions of the method 100 are likewise applicable to the method 200. The method 200 provides further detail as to a method of operating an apparatus to introduce the cleaning solution to the target substrate.

The method 200 begins at block 202 where a substrate is provided. The substrate may be substantially similar to the substrate discussed above with reference to block 102 of the method 100 of FIG. 1. The substrate is placed on a stage (e.g., chuck or base) operable to hold and/or position a substrate such as a semiconductor wafer. In an embodiment, the stage is operable to rotate the substrate. In an embodiment, the stage is operable to heat the substrate (or surface thereof). Referring to the example of FIG. 4, a cleaning apparatus 400 is illustrated and includes a stage 402. The stage 402 holds a substrate—a wafer 404. The wafer 404 may include a feature a gate feature formed on the surface. Other exemplary features include, but are not limited to, interconnect features (e.g., conductive lines and vias), contact features, source/drain features, conductive plate features, doped regions, isolation features, LED elements and portions thereof, trench features, dummy features, etc.

The method 200 then proceeds to block 204 where a surface of the target substrate is heated. The stage may provide the heating of the target substrate. The heating may increase the temperature of the surface of the target substrate targeting for cleaning.

In an embodiment, the target substrate surface is heated concurrently with the cleaning solution being incident the surface. In an embodiment, the target substrate is heated to between approximately 30 degrees Celsius (C) and approximately 60 degrees C. In a further embodiment, the target substrate is heated to approximately 40 degrees Celsius (C). Heating the substrate surface having the incident cleaning solution may provide benefits such as increasing the solubility of ozone such as in DIW, acid or base; improving cleaning efficiency; reducing the amount of ozone lost; increasing impurity removal rate (e.g., $NH_4OH$); and/or other benefits now know or later appreciated. In an embodiment, block 204 is omitted. Referring to the example of FIG. 4, heat energy 414 is illustrated as being provided by the stage 402 to the wafer 404.

The method 200 then proceeds to block 206 where a first fluid including an acid, base, and/or DIW is provided. For example, the first fluid (e.g., liquid or gaseous) may include one of an acid or base in mixture with DIW. Exemplary acids that may be included in the first fluid include hydrochloric acid (HCl) and hydrofluoric acid (HF). Exemplary bases that may be included in the first fluid include ammonium hydroxide ($NH_4OH$). In an embodiment, the first fluid does not include hydrogen peroxide ($H_2O_2$). Thus, an exemplary composition of the first fluid is HF and DIW. Another exemplary composition of the first fluid is DIW and $NH_4OH$. Yet another exemplary composition of the first fluid includes DIW and HCl.

Figure 3:
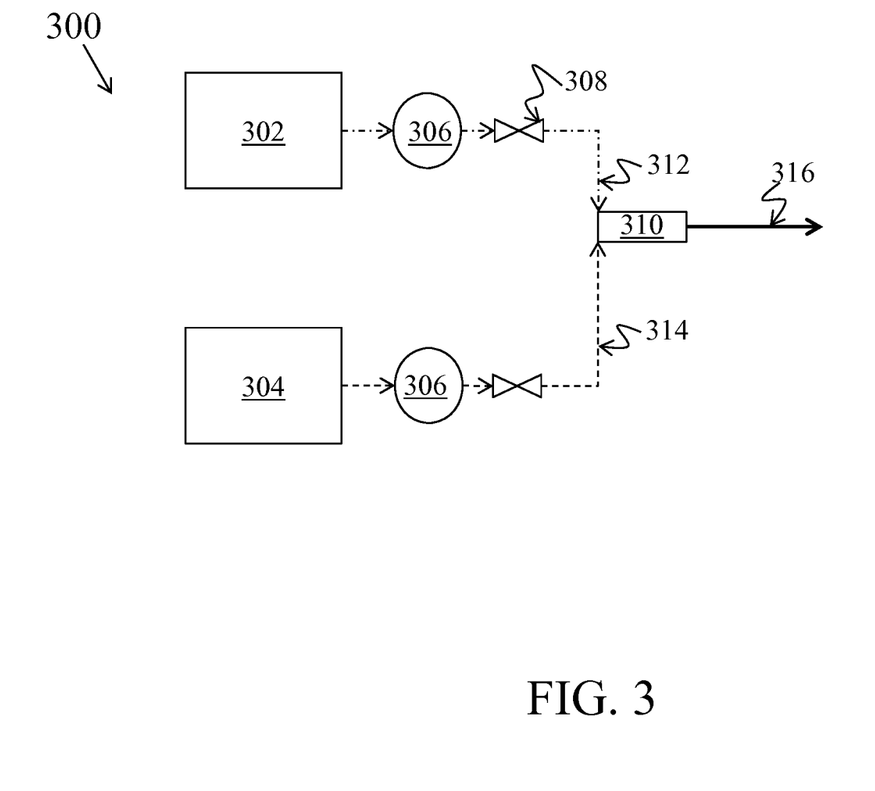
FIG. 3 is a schematic of an embodiment of an apparatus to provide a cleaning solution according to one or more aspects of the present disclosure.

The first fluid may be kept in a reservoir and provided to a cleaning apparatus using devices such as tubing or pipes having pumps, valves, and the like. FIG. 3 provides an exemplary embodiment of a fluid delivery system 300 having a first reservoir 302. In an embodiment, the first reservoir includes DIW and an acid or base. In an embodiment, the first reservoir 302 holds HF and DIW; DIW and HCl; or DIW and $NH_4OH$. The fluid of the first reservoir may be removed from the reservoir by a pump 306. The flow rate of the fluid expelled from the first reservoir may be controlled by a valve 308. In FIG. 3 a first fluid 312 is illustrated. The first fluid 312 may be held in a device such as a tube, pipe, or other apparatus for transporting flowing fluid between the illustrated elements.

Figure 4:
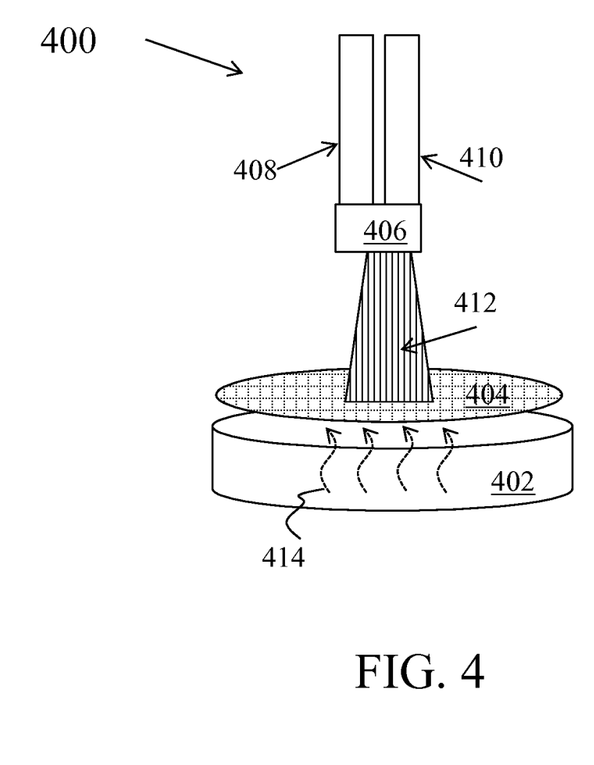
FIG. 4 is a perspective view of an embodiment of an apparatus to provide a cleaning solution to a target semiconductor substrate according to one or more aspects of the present disclosure.

FIG. 4 illustrates a cleaning apparatus 400 that includes a device 408 that is operable to provide a fluid such as the first fluid 312. In an embodiment, the device 408 is operably coupled to and/or includes a reservoir, pumps, and/or valves such as described in FIG. 3. In an embodiment, the device 408 is a tube, pipe or other apparatus operable to transport a flowing fluid. In an embodiment, the first device 408 includes a first fluid such as described with respect to block 206. Thus, in an embodiment, the first device 408 holds and/or delivers HF and DIW; DIW and HCl; or DIW and $NH_4OH$ in the chemical cleaning apparatus 400.

The method 200 then proceeds to block 208 where a second fluid including ozone and DIW is provided. The ozone may be dissolved in DIW (e.g., liquid DIW). The second fluid may be provided at a temperature lower than room temperature. For example, in an embodiment, the second fluid (e.g., ozone) is provided between approximately 15 C and approximately 20 C. It is noted that dissolution of ozone in DIW is based on the temperature and/or pH value of the fluid (e.g., a lower temperature provides for greater dissolution of ozone, an acidic condition provides for greater dissolution of ozone). Thus, the pH and/or temperature of the water and ozone mixture may be controlled to provide adequate ozone solubility. In an embodiment, there are between approximately 5 and 25 ppm of ozone in the DIW.

The second fluid may be kept in a reservoir and provided to a cleaning apparatus using a device such as tubing or pipes having pumps, valves, and the like. FIG. 3 provides an exemplary embodiment of the fluid delivery system 300 having a second reservoir 304. In an embodiment, the second reservoir includes DIW and ozone. The second reservoir 304 may be operable to provide the second fluid at less than room temperature as described above. The fluid of the second reservoir may be removed from the reservoir by the pump 306. The flow rate of the fluid of the second reservoir may be controlled by the valve 308. Second fluid 314 (e.g., ozone and DIW) is illustrated being transported from the reservoir 304. The second fluid 314 in transport may be held in a device such as a tube, pipe, or other apparatus for transporting flowing fluid.

FIG. 4 illustrates the chemical cleaning apparatus 400 that includes a device 410 that is operable to provide a fluid such as the second fluid 314, described above. In an embodiment, the device 410 includes or is operably coupled to a reservoir, pumps, and/or valves such as described in FIG. 3. In an embodiment, the device 410 includes a tube, pipe or other apparatus operable to transport a flowing fluid. In an embodiment, the second device 410 transports and provides a second fluid such as described with respect to block 208. Thus, in an embodiment, the second device 410 holds and/or delivers DIW and ozone in the cleaning apparatus 400. The second device 410 may be operable to provide a fluid at a reduced (e.g., lower than room temperature) temperature.

The method 200 then proceeds to block 210 where the first and second fluids are mixed to provide a cleaning solution. In an embodiment, the first and second fluids are mixed in a mixing chamber. In an embodiment, the first and second fluids are mixed after they are dispersed but prior to being incident the target substrate. In an embodiment, the first and second fluid are mixed in a short mixing loop or cycle such that the mixed fluids do not "sit" after combination but are immediately provided to a target substrate such as described below with reference to block 212. The short mixing loop may provide advantages such as prevention and/or reduction of ozone decay in the acid/base, for example, decay in $NH_4OH$.

FIG. 3 illustrates an embodiment of a mixing chamber 310. In an embodiment, the mixing chamber 310 is a pipe or tubing coupled to the device carrying the first fluid 312 and the second fluid 314. In an embodiment, the first fluid 311 is provided in a first tube/pipe and the second fluid 314 is provided in a second tube/pipe; these tubes/pipes are joined to form a single tube/pipe illustrated as chamber 310. In an embodiment, the fluid flows through the mixing chamber 310 at a given flowrate (e.g., fluid is not stationary within the chamber). A cleaning solution 316, a mixture of the first fluid 312 and the second fluid 314, is expelled from the mixing chamber 310. The cleaning solution 316 may be substantially similar to the cleaning solution described above with reference to block 104 of the method 100 of FIG. 1.

FIG. 4 illustrates an embodiment of a mixing chamber 406. In an embodiment, the mixing chamber 406 is a pipe or tubing coupled to the device 408 and the device 410. In an embodiment, the first device 408 is a first tube/pipe and the second device 410 is a second tube/pipe; these tubes/pipes are joined to form a single tube/pipe illustrated as chamber 406. In an embodiment, fluid flows through the mixing chamber 406 at a given flowrate (e.g., fluid is not stationary within the chamber) and is expelled from the mixing chamber 406 through a spray nozzle. The dispensed cleaning solution 412 is a mixture of the fluid of the first device 408 and the second device 410. The cleaning solution 412 may be substantially similar to the cleaning solution described above with reference to block 104 of the method 100 of FIG. 1.

The first and second fluids of blocks 206 and 208 may be mixed in a predetermined ratio to produce the cleaning solution. In an embodiment, the cleaning solution includes at least one part acid to one part ozone. In an embodiment, the cleaning solution includes one part acid to one part ozone and greater than 40 parts DIW. In a further embodiment, the cleaning solution includes one part acid to one part ozone and approximately 50 parts DIW. In an embodiment, the cleaning solution includes at least one part base to approximately eight (8) parts ozone. In a further embodiment, the cleaning solution includes one part base to approximately 8 parts ozone and approximately 60 parts DIW. Valves such as valves 308 of FIG. 3 may control the amount and/or flowrate of the first fluid 312 and the second fluid 314 to the mixing chamber 310, and thus, the composition of the cleaning solution. For example, FIG. 3 illustrates the cleaning solution 316, a mixture of the first fluid 312 and the second fluid 314, is dispensed from the mixing chamber 310. The amount of the first fluid 312 and the second fluid 314 may be controlled by valves 308.

The method 200 then proceeds to block 212 where the cleaning solution is sprayed onto the target substrate. The cleaning solution may be sprayed onto the substrate using a single-wafer spray tool. Referring to the example of FIG. 4, the cleaning solution 412 is incident the wafer 404. Any number of nozzles may provide the cleaning solution 412.

The following process parameters are provided by way of example and are not intended to be limiting. In an embodiment, the chemical solution spray 412 may be incident the target substrate 404 for a time between approximately 20 second and approximately 80 seconds, by way of example. In a further embodiment, the chemical solution spray 412 may be incident the target substrate 404 for approximately 30 seconds to approximately 55 seconds. The target substrate 404 may spin as the chemical solution is provided to its surface. In an embodiment, the substrate 404 may rotate, for example, at approximately 800 rpm, during the spray.

The method 200 may proceed to other processes such as additional cleaning processes, DIW rinse processes, dry processes, and the like. In an embodiment, the method 200 provides a first cleaning using a first cleaning solution of HF and DIW and ozone, followed by a second cleaning using a second cleaning solution of $NH_4OH$, DIW and ozone, followed by third cleaning process using a third cleaning solution of HCl, DIW and ozone. However, other embodiments are possible and other sequences are possible and within the scope of the present disclosure.

Figure 5:
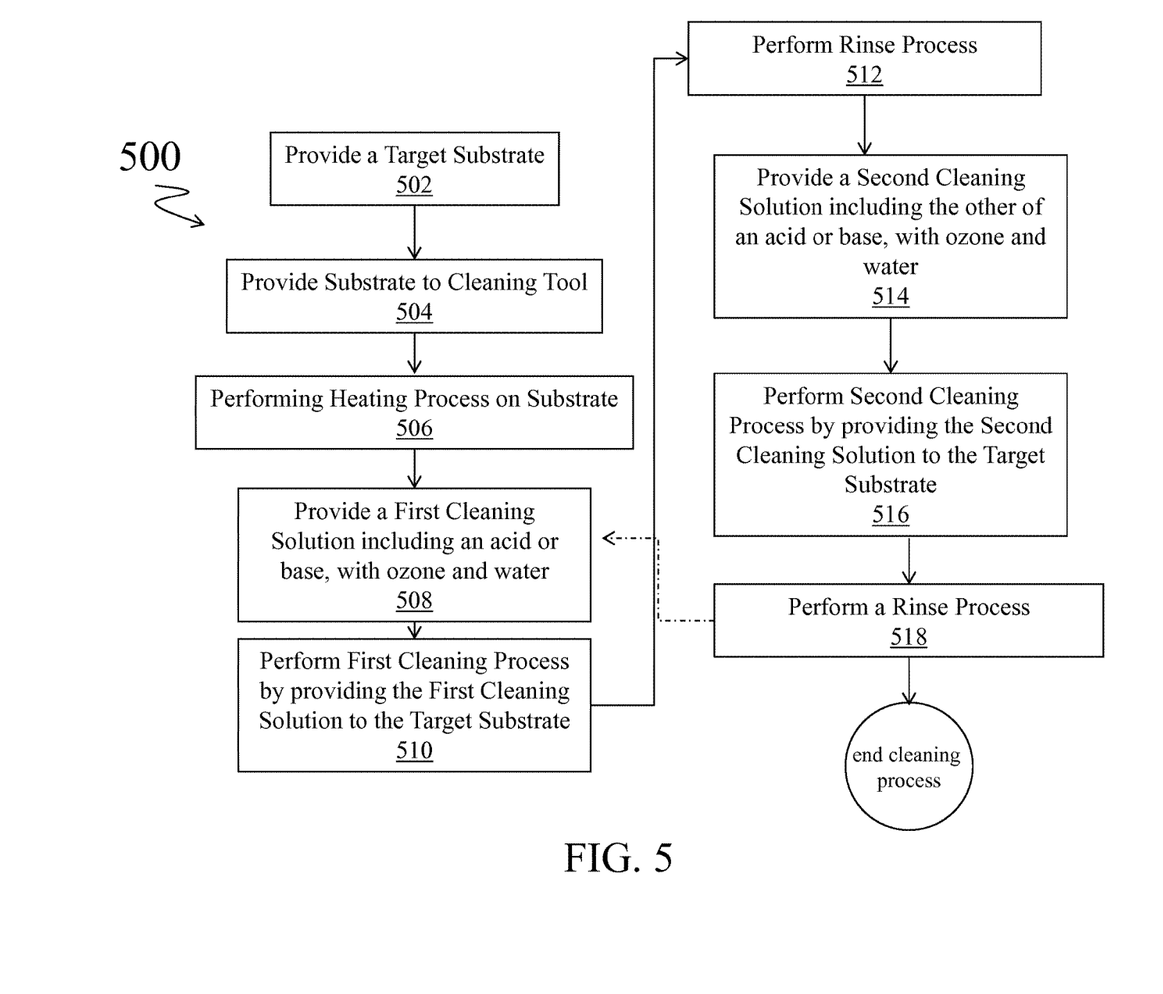
FIG. 5 is a flow chart illustrating an embodiment of a method of cleaning a semiconductor substrate according to another aspect of the present disclosure.

Referring now to the flow chart of FIG. 5, illustrated is a method 500 of cleaning a target substrate such as a semiconductor substrate or wafer. In an embodiment, the method 500 is used to clean a target substrate having one or more fin structures disposed thereon. It is noted that while the method 500 is described as being performed on a target substrate having a fin structure disposed thereon, the method is not so limited unless explicitly claimed otherwise. For example, the process may also be applicable to other processes such as silicon wet removal, metal wet removal, and/or other recognized uses.

The method 500 may be an embodiment that includes one or more steps of the method 100, discussed above. As such, the descriptions of the method 100 are likewise applicable to the method 500. Similarly, the elements of FIGS. 4 and 5 may also be applied to the method 500.

The method 500 begins at block 502 where a substrate is provided. The substrate may be substantially similar to the substrate discussed above with reference to block 102 of the method 100 of FIG. 1. In an embodiment, the substrate provided as a plurality of fin elements extending from the semiconductor substrate. The fin elements may be formed by suitable processes such as, lithography and etching to form "fins" extending from the substrate. Numerous methods of forming fin elements are known in the art and applicable herein. In an embodiment, the substrate includes an active area (OD) upon which a gate will be subsequently formed. In an embodiment, the substrate includes a gate feature disposed on the substrate including for example, a gate dielectric and/or a gate electrode layer. In an embodiment, the substrate may include a feature such as a trench formed by the removal of a dummy gate feature such as typically found in a gate removal process used to form a metal gate structure.

The method 500 may then proceed to block 504 where the substrate is provided to a cleaning tool. The substrate may be provided to a single wafer cleaning tool. In an embodiment, the single wafer cleaning tool may be operable support at least one of 300 mm and 400 mm wafers. FIG. 4 illustrates one embodiment of a single wafer cleaning tool.

The method 500 may then proceed to block 506 where a heating process is performed. In an embodiment, the heating process involves heating a backside of the substrate provided in block 502. The heating of the backside of the substrate may serve to increase the process temperature of the incident cleaning solution, discussed below with reference to block 510 and/or 516. In some embodiments, block 506 occurs (or continues to occur) substantially contemporaneously with blocks 510 and/or 516.

Again, the heating process is provided by heating the target substrate. In a further embodiment, a stage operable to hold the target substrate is heated in order to provide heat to the substrate. The heating may directly incident a backside of the substrate, and increase the temperature of a surface (e.g., an opposing surface) of the target substrate targeting for cleaning. In an embodiment, the backside heating of between approximately 25 degrees and approximately 80 degrees Celsius can be implemented. The heating of the substrate may provide for a process temperature for the cleaning (see block 510 or 516) between approximately 22 and approximate 80 degrees Celsius.

In an embodiment, the heating process is provided by heating the substrate using a hot DIW provided to a backside of the target substrate in order to provide heating of the target substrate. The hot DIW may be operable to control the process temperature of the cleaning process of blocks 510 and/or 516.

The heating process of block 504 may be used to selectively control the etch rates of materials provided by the cleaning solution of block 508 and/or 514. For example, a material etch rate (e.g., silicon, metal) may be controlled by factors including the process temperature. In an embodiment, the material etch rate is controlled by the flow and/or temperature of DIW incident the backside of the target substrate. In other embodiments of the method 500, the heating process is omitted for the wafer (and/or the cleaning solution as discussed below).

The method 500 then proceeds to block 508 where a first cleaning solution is provided. It is noted that the term solution as used herein does not necessitate any homogeneity of the mixture of chemicals but merely their mixture. In an embodiment, the first cleaning solution includes hydrofluoric acid, ozone, and DIW. In another embodiment, the first cleaning solution includes ammonia hydroxide ($NH_4OH$) (a base), ozone, and DIW.

In an embodiment, the first cleaning solution is provided similar to as discussed above with reference to the method 200 and FIGS. 3 and 4. For example, an ozone and DIW solution may be prepared which is mixed with the acid (e.g., HF) prior to being incident the target substrate. In other embodiments, the cleaning solution is mixed at any point prior to being incident the target substrate. As another example, an ozone and DIW solution may be prepared which is mixed with the base (e.g., $NH_4OH$) prior to being incident the target substrate. In other embodiments, the cleaning solution is mixed at any point prior to being incident the target substrate.

In an embodiment, the first cleaning solution has a HF concentration of between approximately 1% and approximately 500 ppm. In an embodiment, the first cleaning solution has an ozone concentration of between approximately 500 ppm and approximately 1 ppm. In a further embodiment, the first cleaning solution has a HF concentration of between approximately 1% and approximately 500 ppm, an ozone concentration of between approximately 500 ppm and approximately 1 ppm, and the remaining concentration of DIW. In an embodiment, a buffer solution such as, $NH_4F$, and/or a surfactant may be added to the first cleaning solution. Thus, in an embodiment, the first cleaning solution has a HF concentration of between approximately 1% and approximately 500 ppm, an ozone concentration of between approximately 500 ppm and approximately 1 ppm, and the remaining concentration of DIW, surfactant, and/or buffer compositions.

In another embodiment, the first cleaning solution has a $NH_4OH$ concentration of between approximately 10% and approximately 0.01% by concentration. In an embodiment, the first cleaning solution has an ozone concentration of between approximately 500 ppm and approximately 1 ppm. Thus, in an embodiment, the first cleaning solution has a $NH_4OH$ concentration of between approximately 10% and 0.01%, an ozone concentration of between approximately 500 ppm and approximately 1000 ppm, and the remaining solution is DIW.

The method 200 then proceeds to block 510 where a first cleaning process is performed. The first cleaning solution may be sprayed onto the target substrate. The first cleaning solution may be sprayed onto the substrate using a single-wafer spray tool. Referring to the example of FIG. 4, the cleaning solution 412 is incident the wafer 404. Any number of nozzles may provide the cleaning solution. As discussed above, the cleaning solution 412 may be one of [1] an HF, ozone, DIW solution (in certain embodiments including a surfactant and/or buffer) or [2] a NH4OH, ozone, DIW solution.

As discussed above with reference to block 506, a heating process may be performed such that the process temperature of the cleaning of block 510 is greater than room temperature. For example, the process temperature of the clean may be between approximately 22 and approximately 80 Celsius. As discussed above, the process temperature may be provided by heating a backside of the target substrate.

In an embodiment of the block 510, the first cleaning process is performed between approximately 30 seconds and approximately 60 seconds. In an embodiment, the first cleaning process includes providing a first cleaning solution including $HF/O_3/DIW$ for approximately 30 seconds. In an embodiment, the first cleaning process includes providing a first cleaning solution including $NH_4OH/O_3/DIW$ for approximately 60 seconds.

The method 500 may proceed to block 512 where a DI water rinse is performed after the first cleaning process. In an embodiment, DIW is incident the wafer during the rinse from between approximately 20 seconds and approximately 30 seconds. In other embodiments, block 512 may be omitted.

The method 500 then proceeds to block 514 where a second cleaning solution is provided. It is again noted that the term solution as used herein does not necessitate any homogeneity of the mixture of chemicals but merely their mixture. In an embodiment, the second cleaning solution can include hydrofluoric acid, ozone, and DIW. In another embodiment, the second cleaning solution can be ammonia hydroxide ($NH_4OH$), ozone, and DIW. The second cleaning solution may be different than the first cleaning solution, described above with reference to block 508.

In an embodiment, the second cleaning solution is provided similar to as discussed above with reference to the method 200 and FIGS. 3 and 4. For example, an ozone and DIW solution may be prepared which is mixed with the acid (e.g., HF) prior to being incident the target substrate. In other embodiments, the cleaning solution is mixed at any point prior to being incident the target substrate. As another example, an ozone and DIW solution may be prepared which is mixed with the base (e.g., $NH_4OH$) prior to being incident the target substrate. In other embodiments, the cleaning solution is mixed at any point prior to being incident the target substrate.

As discussed above, the second cleaning solution may include an acid. For example, in an embodiment, the second cleaning solution has a HF concentration of between approximately 1% and approximately 500 ppm. In an embodiment, the second cleaning solution has an ozone concentration of between approximately 500 ppm and approximately 1 ppm. Thus, in an embodiment, the second cleaning solution has a HF concentration of between approximately 1% and approximately 500 ppm, an ozone concentration of between approximately 500 ppm and approximately 1 ppm, and the remaining concentration of DIW. In an embodiment, a buffer solution such as, $NH_4F$, and/or surfactant may be added to the second cleaning solution. Thus, in an embodiment, the second cleaning solution has a HF concentration of between approximately 1% and approximately 500 ppm, an ozone concentration of between approximately 500 ppm and approximately 1 ppm, and the remaining concentration of DIW, surfactant, and/or buffer compositions.

As also discussed above, the second cleaning solution may include a base. For example, in an embodiment, the second cleaning solution has a $NH_4OH$ concentration of between approximately 10% and approximately 0.01% by weight. In an embodiment, the second cleaning solution has an ozone concentration of between approximately 500 ppm and approximately 1 ppm. In an embodiment, the second cleaning solution has a $NH_4OH$ concentration of between approximately 10% and 0.01%, an ozone concentration of between approximately 500 ppm and approximately 1000 ppm, and the remaining concentration of DIW.

In block 514 it is noted that the second cleaning solution is different than the first cleaning solution. For example, the first cleaning solution may include an acid such as HF, and the second cleaning solution may include a base such as $NH_4OH$. In another embodiment, the first cleaning solution may include a base such as $NH_4OH$, and the second cleaning solution may include an acid such as HF.

The method 500 then proceeds to block 516 where a second cleaning process is performed. The second cleaning solution may be sprayed onto the target substrate. The second cleaning solution may be sprayed onto the substrate using a single-wafer spray tool. In an embodiment, the second cleaning process is performed in-situ with the first cleaning solution of block 508 and/or the rinse process of block 512. Referring to the example of FIG. 4, the cleaning solution 412 is incident the wafer 404. Any number of nozzles may provide the cleaning solution. As discussed above, the cleaning solution 412 may be the second cleaning solution of the method 500 and be one of [1] an HF, ozone, DIW solution (in certain embodiments including a surfactant and/or buffer) or [2] a NH4OH, ozone, DIW solution.

As discussed above with reference to block 506, a heating process may be performed such that the process temperature of the cleaning of block 516 is greater than room temperature. For example, the process temperature of the clean may be between approximately 22 and approximately 80 Celsius. As discussed above, the process temperature may be provided by heating a backside of the target substrate. The process temperature of block 516 and the process temperature of block 510 may be different. In an embodiment, the process temperature of each of blocks 516 and 510 are determined based on the chemical composition, desired etch rate, and/or other factors. Thus, as the chemical compositions between block 516 and 510 differ, it follows that it may be desired to vary the process temperature.

In an embodiment of the block 516, the second cleaning process is performed between approximately 30 seconds and approximately 60 seconds. In an embodiment, the second cleaning process includes providing a second cleaning solution including $HF/O_3/DIW$ for approximately 30 seconds. In an embodiment, the second cleaning process includes providing a second cleaning solution including $NH_4OH/O_3/DIW$ for approximately 60 seconds.

Thus, in an embodiment, the method 500 provides a first cleaning solution including $HF/O_3/DIW$ is provided in block 508 and a second cleaning solution of $NH_4OH/O_3/DIW$ is provided in block 514. In a further embodiment, $HF/O_3/DIW$ is provided in block 510 for approximately 30 seconds, while $NH_4OH/O_3/DIW$ is provided in block 514 for approximately 60 seconds.

The method 500 may proceed to block 518 where a DI water rinse is performed after the first cleaning process. In an embodiment, DIW is incident the wafer during the rinse from between approximately 20 seconds and approximately 30 seconds. In an embodiment, the DIW rinse of block 518 is approximately 30 seconds. In a further embodiment, the DIW rinse of block 512 is approximately 20 seconds. In embodiments, block 518 may be omitted.

In embodiments, of the method 500 the method may return to block 508 where the first cleaning process is performed again. For example, in an embodiment, the first cleaning solution includes $HF/O_3/DIW$ and the second cleaning solution includes $NH_4OH/O_3/DIW$ and the method 500 provides a process providing the first cleaning solution, followed by the second cleaning solution, which is repeated. In a further embodiment, it is repeated two times.

The method 500 may proceed to other steps known in the art including drying processes. In an embodiment, following the steps of the method 500 a feature is formed on the surface which the first and second cleaning processes were performed upon. Examples of features subsequently formed on the cleaned surface include, but are not limited to, a gate structure or metal layers of a gate structure such as in a replacement gate process.

In summary, the methods and devices disclosed herein provide for a cleaning solution, cleaning method and apparatus for cleaning a target substrate such as a semiconductor substrate or wafer. In doing so, embodiments of the present disclosure may offer advantages over prior art methods. Exemplary advantages include savings of cost and/or reduction of environmental impact of use of chemicals in semiconductor device fabrication processes. For example, conventional cleans often use $H_2O_2$ as a component of the cleaning chemical as an oxidant for particle removal, metal ion removal, and/or surface oxidation. The use of $H_2O_2$ can lead to un-reacted chemicals in the process being wasted; thus, providing an environmental and monetary cost. In an embodiment, the cleaning solution of the present disclosure provides for the omission of $H_2O_2$. It is understood that different embodiments disclosed herein offer different disclosure, and that they may make various changes, substitutions and alterations herein without departing from the spirit and scope of the present disclosure.

Thus, the present disclosure provides numerous exemplary embodiments. In an embodiment, a method is described that provides a semiconductor substrate. The method continues to include cleaning the semiconductor substrate with a mixture of ozone and at least one of an acid and a base.

In a further embodiment, the ozone is dissolved in water and provided at less than or equal to approximately 20 degrees. The cleaning may further include heating the semiconductor substrate while the ozone and the at least one of the acid and base is incident the semiconductor substrate. In embodiments, the method may continue to include rinsing the semiconductor substrate with de-ionized wafer after the cleaning.

In a further embodiment, the mixture of ozone and at least one of an acid and a base includes a base ($NH_4OH$). In another embodiment, the mixture includes an acid (HCl). In yet another embodiment, the mixture includes an acid (HF). In an embodiment, the mixture of ozone and the at least one of an acid and a base includes at least one part of ozone for every part of the at least one acid and base. In a further embodiment, the mixture of ozone and the at least one of an acid and a base further includes at least 40 parts of de-ionized water for every part of the at least one acid and base.

In another of the broader forms of an embodiment of the present disclosure, a method of cleaning a semiconductor substrate is provided. The method includes providing a first device operable to hold a fluid. A first mixture of ozone and water is delivered to the first device. A second device operable to hold a fluid is also provided. A second mixture of water and at least one of an acid and a base is delivered to the second device. The first mixture is expelled from the first device and the second mixture is expelled from the second device. The expelled first and second mixtures to form a cleaning solution. The cleaning solution is provided onto a surface of the semiconductor substrate.

In a further embodiment of the method above, a stage is provided for the semiconductor substrate; the stage is operable to heat the semiconductor substrate. In an embodiment, the semiconductor substrate is heated to between approximately 20 and 60 degrees Celsius. The stage may also rotate the semiconductor substrate while the cleaning solution is provided to the surface of the semiconductor substrate.

The first device (holding the first mixture) may be a first tube and the second device may be a second tube. The first and second tubes may be joined to form a single tube, within which the mixing the first and second mixtures is performed. Mixing the first and second mixtures to form the cleaning solution may be performed substantially coincident with spraying the chemical solution to provide the cleaning solution to the surface of the semiconductor substrate.

In yet another embodiment, a method of fabricating a semiconductor device is provided that includes forming a first feature on a surface of a semiconductor wafer. A first cleaning mixture is sprayed onto the first feature on the surface—the first cleaning mixture includes ozone and an acid. After stopping the spraying of the first cleaning mixture, spraying a second cleaning mixture onto the second feature on the surface—the second cleaning mixture includes ozone and $NH_4OH$. In an embodiment, the acid of the first cleaning mixture is HCl.

In a further embodiment, after spraying the second cleaning mixture, the method proceeds to include rinsing and drying the semiconductor wafer. The spraying processes may include spraying only a single wafer at a given time. In an embodiment, after spraying the first cleaning mixture, the method includes rinsing and drying the semiconductor wafer and forming a second feature on the surface of the wafer prior to spraying the second cleaning mixture.

In another of the broader embodiments provided herein, a substrate is provided. A first cleaning of the semiconductor substrate is performed with a first cleaning solution including ozone, one of an acid and a base, and water. The semiconductor substrate is rinsed after the first cleaning. After the rinsing, performing a second cleaning of the semiconductor substrate with a second cleaning solution including ozone, water, and the other one of an acid and a base.

In another embodiment, a method of cleaning a semiconductor substrate includes providing a first cleaning solution including HF, ozone and water onto a surface of the semiconductor substrate. Rinsing the semiconductor substrate after the providing the first cleaning solution and then providing a second cleaning solution including $NH_4OH$, ozone and water onto the surface of the semiconductor substrate after the rinsing.

In a further embodiment, the providing the first cleaning solution including HF, ozone and water includes providing between approximately 1% and approximately 500 parts per million (ppm) of HF and providing between approximately 500 and 1 ppm of ozone. In a further embodiment, providing the second cleaning solution including $NH_4OH$, ozone and water includes providing between approximately 10% and approximately 0.01% of $NH_4OH$ and providing between approximately 500 and 1 ppm of ozone.

In yet another of the broader embodiments, a method of fabricating a semiconductor device includes forming a first feature on a surface of a semiconductor wafer. (In one example, the feature may be a gate structure.) A first cleaning mixture is sprayed onto the first feature on the surface, wherein the first cleaning mixture includes ozone and HF. After stopping the spraying of the first cleaning mixture, a second cleaning mixture is sprayed on the first feature on the surface. The second cleaning mixture includes ozone and $NH_4OH$. In an embodiment, the spraying the second cleaning mixture is in-situ with spraying the first cleaning mixture. For example, in-situ in a single wafer cleaning tool such as discussed above.

What is claimed is:

1. A method of cleaning a semiconductor substrate, comprising:

providing the semiconductor substrate having a plurality of fin elements extending from the semiconductor substrate;

removing a dummy gate structure disposed over the plurality of fin elements to form a trench of the semiconductor substrate;

providing the semiconductor substrate having the plurality of fin elements and a trench to a single wafer cleaning tool;

using the single wafer cleaning tool, performing a series of cleaning steps to a surface of the trench and the plurality of fin elements:

performing a first cleaning of the semiconductor substrate with a first cleaning mixture including ozone, HF, and water, and not including hydrogen peroxide;

rinsing the semiconductor substrate after the first cleaning; and after the rinsing, performing a second cleaning of the semiconductor substrate with a second cleaning mixture including ozone, water, and $NH_4OH$ and not including hydrogen peroxide.

2. The method of claim 1, wherein the first cleaning and the second cleaning further includes heating a backside of the semiconductor substrate while the first and second cleaning mixtures are incident the semiconductor substrate.

3. The method of claim 1, further comprising:
rinsing the semiconductor substrate after the second cleaning.

4. A method of cleaning a semiconductor substrate, comprising:

providing a semiconductor substrate having a plurality of fins and including a surface;

providing a first cleaning solution including HF, ozone and water onto the surface of the semiconductor substrate, and wherein the first cleaning solution does not include hydrogen peroxide;

rinsing the surface of the semiconductor substrate after the providing the first cleaning solution; and providing a second cleaning solution including $NH_4OH$, ozone and water onto the surface of the semiconductor substrate after the rinsing, wherein the second cleaning solution does not include hydrogen peroxide.

5. The method of claim 4, further comprising:
heating a backside of the semiconductor substrate, the backside opposing the surface of the semiconductor substrate, during the providing the first cleaning solution and the providing the second cleaning solution.

6. The method of claim 4, wherein the providing the first cleaning solution has a duration of approximately 30 seconds and the providing the second cleaning solution has a duration of approximately 60 seconds.

7. The method of claim 4, wherein the providing the first cleaning solution further comprises providing at least one of a $NH_4F$ and a surfactant.

8. The method of claim 4, further comprising:
after providing the second cleaning solution, providing a second occurrence of the first cleaning solution including HF, ozone and water onto the surface of the semiconductor substrate;

thereafter, providing a second occurrence of the second cleaning solution including $NH_4OH$, ozone and water onto the surface of the semiconductor substrate.

9. The method of claim 4, further comprising:
applying a hot deionized water (DIW) flow to a backside of the semiconductor substrate, wherein the hot DIW increases a temperature of the semiconductor substrate;

while applying the hot DIW, performing the providing the first cleaning solution; and while applying the hot DIW, performing the providing the second cleaning solution.

10. The method of claim 4, wherein the providing the semiconductor substrate having the plurality of fins and including the surface includes removing a dummy gate structure disposed over the plurality of fins to form a trench of the semiconductor substrate, wherein the surface is within the trench.

11. A method of cleaning a semiconductor substrate, comprising:

providing a semiconductor substrate having a plurality of fins and including a surface;

providing a first cleaning solution consisting of HF, ozone and water onto the surface of the semiconductor substrate;

rinsing the surface of the semiconductor substrate after the providing the first cleaning solution; and providing a second cleaning solution consisting of $NH_4OH$, ozone and water onto the surface of the semiconductor substrate after the rinsing.

12. The method of claim 11, further comprising:

heating a backside of the semiconductor substrate, the backside opposing the surface of the semiconductor substrate, during the providing the first cleaning solution and the providing the second cleaning solution.

13. The method of claim 11, wherein the providing the first cleaning solution has a duration of approximately 30 seconds and the providing the second cleaning solution has a duration of approximately 60 seconds.

14. The method of claim 11, further comprising:

after providing the second cleaning solution, providing a second occurrence of the first cleaning solution consisting of HF, ozone and water onto the surface of the semiconductor substrate;

thereafter, providing a second occurrence of the second cleaning solution consisting of $NH_4OH$, ozone and water onto the surface of the semiconductor substrate.

* * * * *